(12) United States Patent
Sandner

(10) Patent No.: US 7,929,192 B2
(45) Date of Patent: Apr. 19, 2011

(54) METHOD OF FABRICATING A MICROMECHANICAL STRUCTURE OUT OF TWO-DIMENSIONAL ELEMENTS AND MICROMECHANICAL DEVICE

(75) Inventor: Thilo Sandner, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 426 days.

(21) Appl. No.: 12/058,812

(22) Filed: Mar. 31, 2008

(65) Prior Publication Data
US 2008/0239429 A1   Oct. 2, 2008

(30) Foreign Application Priority Data

Apr. 2, 2007 (DE) .......................... 10 2007 015 722
Mar. 6, 2008 (DE) .......................... 10 2008 012 826

(51) Int. Cl.
*G02B 26/08* (2006.01)
(52) U.S. Cl. .................................................. 359/212.1
(58) Field of Classification Search ............... 359/212.1, 359/223.1–226.1
See application file for complete search history.

(56) References Cited

U.S. PATENT DOCUMENTS

| | | | |
|---|---|---|---|
| 5,725,363 A | 3/1998 | Buestgens et al. | |
| 6,595,055 B1 | 7/2003 | Schenk et al. | |
| 6,644,117 B1 | 11/2003 | Kueck et al. | |
| 6,865,943 B2 * | 3/2005 | Okada ........................ | 73/504.12 |
| 2005/0013087 A1 | 1/2005 | Wu et al. | |
| 2008/0050561 A1 | 2/2008 | Joisten et al. | |

FOREIGN PATENT DOCUMENTS

| | | |
|---|---|---|
| DE | 44 02 119 A1 | 7/1995 |
| DE | 199 48 613 A1 | 4/2001 |
| EP | 1 123 526 B1 * | 7/2002 |
| FR | 2 880 731 A1 | 7/2006 |

OTHER PUBLICATIONS

English language translation of an Official Communication issued in corresponding Chinese Patent Application No. 2008100818043, mailed on Jun. 23, 2010.

* cited by examiner

*Primary Examiner* — Euncha P Cherry
(74) *Attorney, Agent, or Firm* — Keating & Bennett, LLP

(57) ABSTRACT

In a method of fabricating a micromechanical structure, first, a deflectably supported two-dimensional structure is formed in a substrate and, then, is arranged in a package such that an integrated micromanipulator is arranged between the package and the two-dimensional structure so as to effect a deflection of the two-dimensional structure out of a plane of the substrate.

16 Claims, 12 Drawing Sheets

FORMING A DEFLECTABLY SUPPORTED TWO-DIMENSIONAL STRUCTURE IN A SUBSTRATE ~100

PACKAGING THE DEFLECTABLY SUPPORTED TWO-DIMENSIONAL STRUCTURE WITH A PACKAGE, WITH INTEGRATED MICROMANIPULATOR, SUCH THAT A THREE-DIMENSIONAL STRUCTURE RESULTS FROM A FORCE ACTION BY THE DEFLECTION OF THE TWO-DIMENSIONAL STRUCTURE, IN PACKAGING ~102

METHOD OF FABRICATING A MICROMECHANICAL STRUCTURE OUT OF TWO-DIMENSIONAL ELEMENTS AND MICROMECHANICAL DEVICE

CROSS-REFERENCE TO RELATED APPLICATIONS

This application claims priority from German Patent Application No. 102008012826.0, which was filed on Mar. 6, 2008 and German Patent Application No. 102007015722.5, which was filed on Apr. 2, 2007, which are both incorporated herein in their entirety by reference.

TECHNICAL FIELD

The present invention relates to the fabrication of micromechanical three-dimensional (3D) structures by means of mechanical pre-deflection of two-dimensional (2D) structures out of a wafer plane or substrate plane and subsequent possible fixation in the deflected state.

BACKGROUND

Such three-dimensional structures are employed in micro and microsystem technology and are used for the fabrication of electrostatic three-dimensional drive structures, for example. Such drives may be of interest for a multitude of microsystems, and specifically for microscanners for image projection. Such 3D structures may, for example, be utilized to realize an electrostatic drive capable of generating forces and moments out of a wafer plane across a large translation and/or rotation range.

Several ways of deflecting structures out of a wafer plane are known. Known methods utilize material stresses of a substrate material or a substrate-layer combination for warping the substrate at defined locations. The warping may then be utilized for tilting or rotating the structures out of the substrate. The material stress may be intrinsic in material pairings or may be impressed by means of a so-called actor. However, the curvatures of the substrate achievable by means of material stress are slight. In addition, there will be extensive space necessitatements on the substrate in order to build up the material stress and realize significant angles of attack of structures with respect to the substrate. Same may be enlarged by means of local down-thinning of the substrate, which may, however, weaken the mechanical stressability of the structure to be deflected and result in low-frequency oscillation modes.

SUMMARY

According to an embodiment, a method of fabricating a micromechanical structure may have the steps of: forming a deflectably supported two-dimensional structure in a substrate; and arranging the deflectably supported two-dimensional structure in a package such that an integrated micromanipulator is arranged between the package and the two-dimensional structure so as to effect a deflection of the two-dimensional structure out of a plane of the substrate.

According to another embodiment, a micromechanical device may have: a package; a substrate; a two-dimensional structure arranged in the substrate; and a micromanipulator arranged between the package and the two-dimensional structure such that the two-dimensional structure is deflected out of a plane of the substrate.

Embodiments of the invention show that the micromanipulator may be embodied as a permanent component of the device package. During the packaging of the micromechanical device, the pre-deflection or deflection of the deflectably supported two-dimensional structure and therefore the realization of a three-dimensional structure may be effected by means of the micromanipulator. After the realization of the three-dimensional structure, the micromanipulator may remain in the micromechanical device so that the three-dimensional deflection of the structure may already be permanently defined by the geometry as well as by the form and force closure with the micromanipulator.

In force and/or moment initiation via the micromanipulator, the device may, according to its support, rotate, tilt or shift out of the wafer plane. The deflected member or the three-dimensional structure may now be fixed. A fixing may be effected in a form-fit, force-fit or material-fit manner. As a form-fit fixing method, e.g. mechanical hooks or latches may be used which block and/or arrest the two-dimensional method in the deflected state. As a material-fit fixing method, e.g. adhering, bonding, soldering or connecting by alloying may be performed. The deflected two-dimensional elements may be fixed in a force-fit manner by the acting of adhesion forces, clamping forces and friction forces, for example. Following that, the two-dimensional element of the structured wafer plane forms a three-dimensional element.

The micromanipulator may be embodied as a micromechanically or precision mechanically fabricated structure and may be a permanent component of the packaged device. The micromanipulator may be in permanent engagement with the two-dimensional structure to be pre-deflected.

BRIEF DESCRIPTION OF THE DRAWINGS

Embodiments of the present invention will be detailed subsequently referring to the appended drawings, in which.

DETAILED DESCRIPTION

Figure 1:
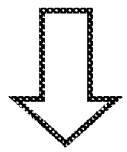
FIG. 1 is a flowchart showing a method of fabricating a micromechanical structure according to an embodiment of the invention.

Referring to FIG. 1, the method for the fabrication of three-dimensional micromechanical devices from two-dimensional elements is discussed by means of the flowchart. The method comprises the forming 100 of a deflectably supported two-dimensional structure in a substrate and the arranging 102 of the deflectably supported two-dimensional structure in a package or in parts of a package structure (packaging). The package comprises an integrated micromanipulator so that, by means of a force action of the micromanipulator on the two-dimensional structure, a deflection of the two-dimensional structure out of the substrate plane so as to form the three-dimensional structure is performed. The micromanipulator may be part of the package, e.g. of the package cap, so that same, in fitting the cap, contacts the two-dimensional structure and deflects same. Alternatively, the micromanipulator may be part of the two-dimensional structure so that, for example in sealing the package, a cap contacts the manipulator and effects a deflection of the two-dimensional structure. The micromanipulator may also be a separate member which, after the insertion of the two-dimensional structure into a package, is also arranged in the package so that, in fitting the cap, the two-dimensional structure is deflected by the micromanipulator.

The formation of the deflectably supported two-dimensional structures in a substrate may be effected in a wafer, for example. That is, the three-dimensional elements or structures are first microtechnically fabricated as two-dimensional structures in the substrate plane. This allows for good fabricability of the structures. The two-dimensional structures are fabricated such that they are deflectable but retained in the substrate plane by means of dedicated fixed bearings, for example. The fixed bearings determine the structures' degree of freedom for the deflection out of the plane. The structures may at a suitable location be provided with mechanical contact pads, via which then, by means of a mechanical structure such as a mandrel, a pin, a needle, a mesa structure or any other means, a force or a moment may be introduced into the two-dimensional device in a defined manner. In the following, these structures will be referred to as micromanipulators or microactuators. A mesa structure may be an elevated, plateau-like semiconductor structure, the environment of which having been etched off. By means of this, the 2D structure may be pre-deflected out of the substrate plane, thereby producing a 3D structure.

The micromanipulator may be integrated as a permanent component of the device package or with parts of the package and thus utilized to exert, in packaging the micromechanical device, a force or a moment on the two-dimensional device in a defined manner so as to thereby deflect the two-dimensional structure, thereby forming the three-dimensional structure. After the realization of the three-dimensional structure by means of the micromanipulator, which may be a permanent component of the package, the micromanipulator may remain in permanent use in the micromechanical device so that the three-dimensional deflection of the structure is permanently defined already by the geometry as well as the form and force closure with the micromanipulator. What is also conceivable is that the deflected two-dimensional structure is fixed in the deflected position by other means. This fixing may be effected in a form-fit, friction-fit or material-fit manner.

The packaging of the micromechanical device may be effected at wafer level, whereby the number of simultaneously packaged micromechanical devices may be increased, or else in individual steps. It is also conceivable that the micromechanical devices are first diced and then installed in external packages made of metal, plastic, glass or ceramic, for example.

The following embodiment illustrates a microtechnically two-dimensionally fabricated and rotatably supported electrode structure on a wafer or an already diced chip and the fabrication of a three-dimensional structure such as a three-dimensional drive electrode by means of erecting this two-dimensional structure by means of a micromanipulator permanently connected to the package or the packaged microtechnical device during the packaging process. The manner is shown in which these two-dimensional structures may be deflected out of a plane and permanently fixed there by means of mechanical structures—the micromanipulators or microactuators—during the packaging. It is to be noted that the different ways of deflecting and fixing the two-dimensional structure may be combined with one another in great variety of ways, which is why not all ways are illustrated herein. Therefore, the embodiments shown are in no way any limitation of the inventive method and of the micromechanical devices having an integrated micromanipulator and being fabricated by means of the inventive method.

Figure 2:
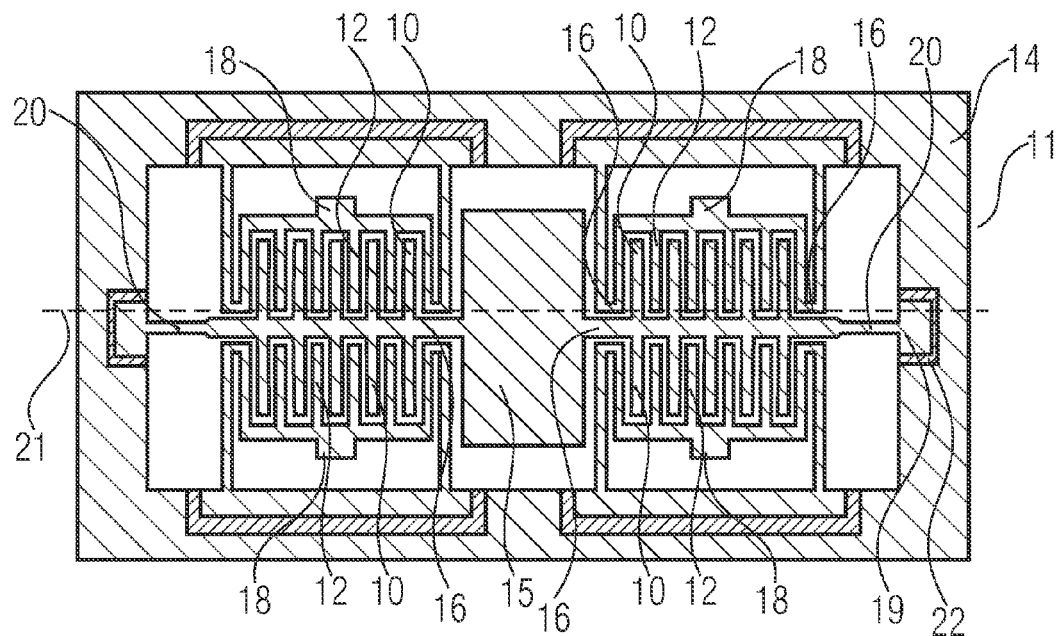
FIG. 2 is a top-view representation of a micromechanical one-dimensional scanner mirror prior to packaging.

FIG. 2 shows a top-view representation of a micromechanical one-dimensional scanner mirror 11 prior to packaging, wherein movable 10 and stationary 12 drive or comb electrodes will be located in the same substrate plane 14 of a two-dimensionally structured wafer after the micromechanical fabrication. The movable drive electrodes 10 are mounted, together with the scanner mirror 15, to a rotatorily supported torsion axis 20. The stationary electrodes 12 are also rotatorily supported on a torsion axis 21 via torsion springs 16. By means of force initiation at the contact pads 18 by means of a micromanipulator, the stationary electrodes 12 may be deflected out of the substrate plane 14, whereby they create a three-dimensional structure. The two-dimensional structure may, for example, be fabricated in the so-called Silicon-On-Insulator (SOI) technology and may be supported via fixed bearings 19 which remain on the underlying oxide layer 22 after etching the silicon substrate 14.

Figure 3:
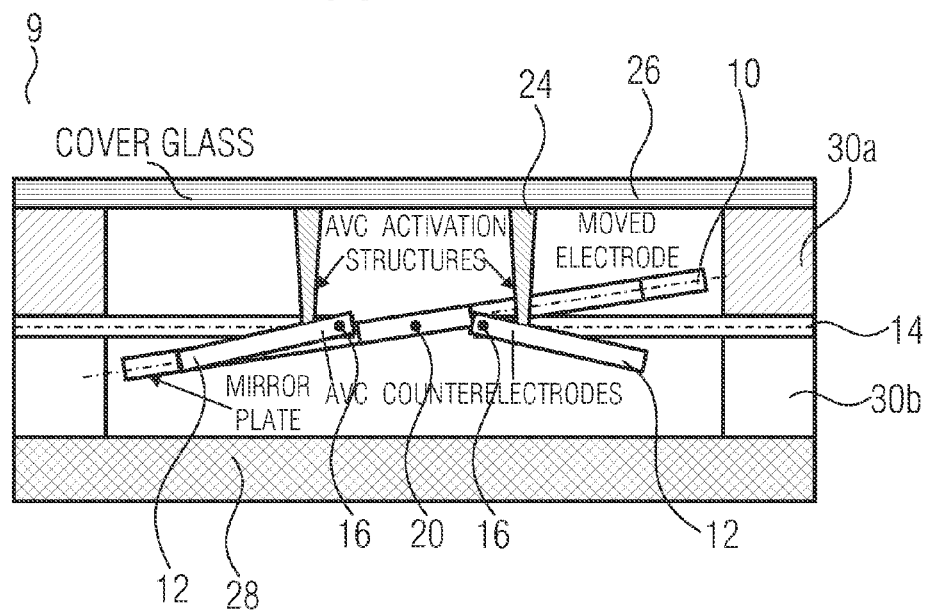
FIG. 3 is a cross-sectional representation of a packaged one-dimensional scanner mirror according to an embodiment of the present invention.

FIG. 3 shows an embodiment of the present invention by means of a cross-sectional representation of an already packaged one-dimensional scanner mirror according to FIG. 2. The cross-sectional representation runs perpendicular to the torsion axis 20 of the scanner mirror. The two-dimensional structure is tilted out of the wafer plane by means of a mechanical structure, the micromanipulator 24, which attacks at the contact pads 18 (see FIG. 1) of the tiltably supported stationary electrode structure 12. Here, the micromanipulator structure 24, which is utilized for the three-dimensional deflection and is in the following referred to as an activation structure or microactuator structure, is permanently connected to the device package 22. The micromanipulator 24 may be connected to the cap structure 26 of the device package 22. After aligning the optical cover glass 26, the stationary drive electrode 12 is deflected by means of pressing the planar connecting rib 18 of the counter-electrodes 12 downwards. I.e., next to hermetically sealing the package, the optical cover glass 26 may also serve as a support for the micromanipulator. The rotation of the stationary electrodes 12 is effected with force action on the rotation axis by means of torsion springs 16.

After pressing the cover glass down, same may permanently be connected to the microdevice to be packaged, in a direct or immediate manner via a frame structure 30a, which serves as a spacer and may be utilized for realizing a cavity structure. Here, the connection between the micromechanical device 14, the spacer 30, the glass cover 26 and the bottom substrate 28 may be effected by means of e.g. adhering, wafer bonding, anodic or silicon direct-bonding, soldering, connecting by alloying, by means of Solid Liquid Inter Diffusion (SLID) or any other form-fit connection. The deflection of the two-dimensional structure is fixedly defined by the geometry, the placement and well as the fabrication and alignment tolerances of the micromanipulator.

Therefore, packaging may also be regarded as an alignment of a cover glass relative to the microdevice and the pressing-down of the cover glass by means of the integrated micromanipulator for hermetically sealing the package and for deflecting the 2D structure, for example. It is, however, also conceivable that the package is not hermetically sealed and the micromanipulator is permanently connected only to parts of a package structure, which may comprise a frame structure, a cover structure or a bottom structure, for example.

The packaging of the micromechanical device, in this embodiment of the micromirror, as well as the simultaneous pre-deflection of the two-dimensional structure for the realization of three-dimensional structures, may advantageously be effected in the wafer matrix so as to obtain high parallelism in the packaging of the devices and therefore enable lower fabrication cost. However, all the embodiments described above and below equally apply to the packaging and simultaneous deflection of a single micromechanical device.

It is conceivable that the contact pads in direct mechanical contact during the deflection of the two-dimensional structure are coated with additional wear-resistant or ductile materials so as to reduce stress and avoid the formation of particles. Here, both the contact pads of the two-dimensional structures to be deflected and the micromanipulator contact pads may be coated with additional no-wear materials. These materials may be e.g. oxides, nitrides, silicon nitride, carbide layers, diamond layers and/or ductile layers such as metals like gold, aluminum, aluminum alloys, nickel and other metals. However, they may also be polymers such as photoresist, polyamides, Teflon or other polymer materials.

Moreover, the contact pads of the micromanipulators employed for the deflection of the two-dimensional structures may be geometrically designed such that they exhibit, for the deflection angle to be realized of the two-dimensional structures to be deflected, a maximum contact pad that is aligned in parallel to the deflected two-dimensional structure.

The contact pad of the two-dimensional structure to be deflected may be configured such, by means of supporting the surface of force attack of the micromanipulator by means of additional spring elements, that the contact pad of the deflected two-dimensional structure may on its own initiative align in parallel to the contact pad of the attacking micromanipulator. This serves to achieve a contact pad as large as possible between the deflected two-dimensional structure and the attacking micromanipulator.

Furthermore, the deflection of the two-dimensional structure by means of the micromanipulator having been accomplished, their common contact may be permanently fixed by the use of material-fit, such as adhering, bonding, soldering, SLID, connecting by alloying or form-fit, such as mechanical latching, or force-fit connections. Force-fit connections may be achieved by e.g. adhesion, friction or clamping forces. The two-dimensional structures to be deflected by means of micromanipulators may be movably supported via torsion support, via parallel guide by respective joints, such as a four-hinged joint or else support via flexion springs, for example.

In FIG. 3, the movable electrode 10 tilted via the torsion axis 20 and the stationary electrodes 12 (AVC counter-electrodes) deflected via the two micromanipulators 24 (Angular Vertical Comb (AVC) activation structures) and via the torsion springs 16 are illustrated. The frame structure 14 with the integrated device is arranged between the cap structure 26, a frame structure 30a and a bottom-substrate structure 28 with the associated spacer 30b.

Figure 4:
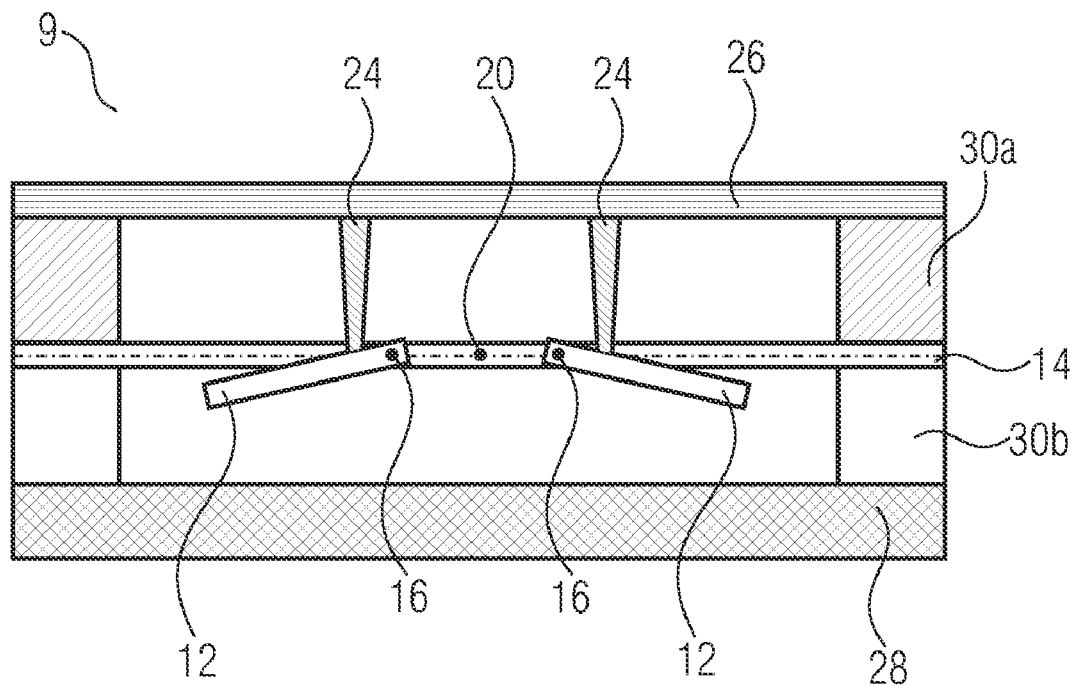
FIG. 4 is a cross-sectional representation of a packaged device having two-dimensional structures deflected downwards via a micromanipulator structure, according to a further embodiment of the present invention.

In FIG. 4, a packaged micromechanical device with tilted two-dimensional structures pre-deflected downwards by means of micromanipulator structures is illustrated. Here, the micromanipulator structures 24 are permanently connected to an optical cover substrate 26 which, in the relevant wavelength range of electromagnetic radiation interacting with the scanner mirror 15, exhibits a high transmission degree. The cover glass 26 may be permanently connected to the micromechanical device after packaging. Here, the cover glass may be connected either directly or indirectly via a frame or a spacer structure 30a, which in turn may be comprised of several individual components. Optionally, the micromechanical device may be permanently sealed on its back side by means of a bottom substrate 28 and a frame structure 30b.

Figure 5:
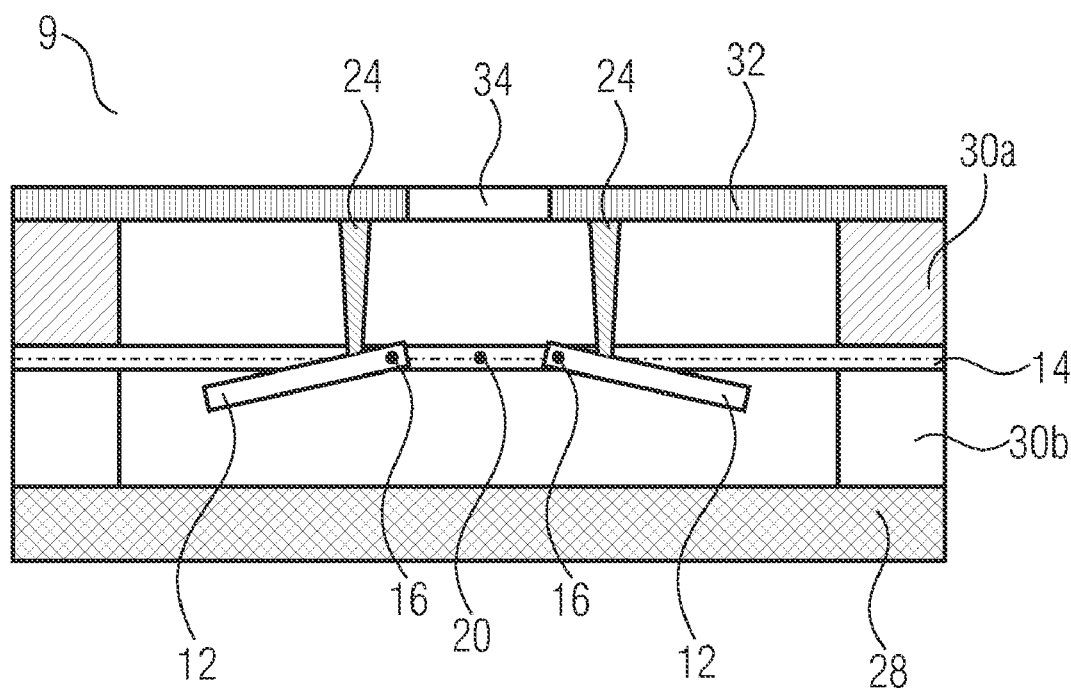
FIG. 5 is a cross-sectional representation of a packaged micromechanical device according to a further embodiment of the present invention.

FIG. 5 shows an embodiment of a packaged micromechanical device 9 having tilted two-dimensional structures pre-deflected downwards by means of micromanipulator structures 24. Again, the structures may, for example, be the above-mentioned scanner mirror with the respective electrodes 12 and the respective torsion axis 20 and/or the torsion springs 16. The micromanipulator structure 24 may be permanently or monolithically connected with a support structure 32. The support structure 32 itself need not exhibit any optical function, for example, and therefore need not be transparent, but it may, in the area of the optically effective surface of the micromechanical device 9, have an aperture 34 for unobstructed optical coupling and decoupling. For micromechanical devices without any optical function, no aperture 34 is necessitated in the support structure 32.

After packaging, the support structure is permanently connected to the micromechanical device. The support structure is connected either directly or indirectly via a frame spacer structure 30a. Optionally, the micromechanical device may again be hermetically sealed on its back side by means of a bottom substrate 28 and the frame structure 30b.

Figure 6:
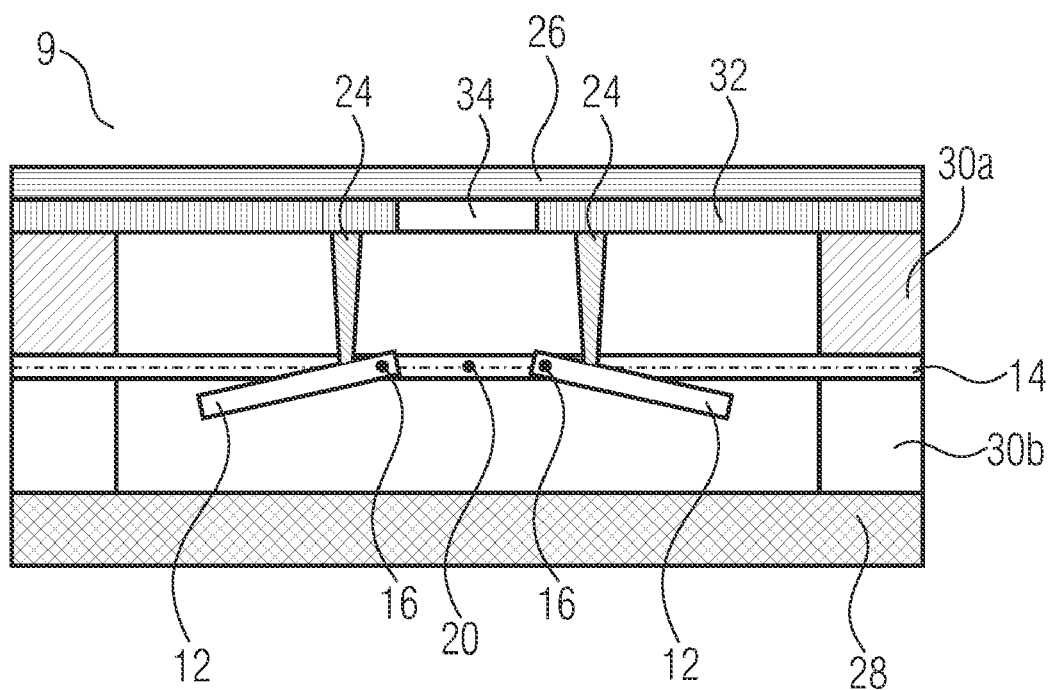
FIG. 6 is a cross-sectional representation of a packaged micromechanical device having the top side thereof sealed by means of an optical cover glass.

As a further embodiment, FIG. 6 again shows a cross-sectional representation of a micromechanical device 9, which is configured in analogy to the embodiment of FIG. 5, wherein the packaged micromechanical device 9 is on its top side and/or front side sealed by means of an optical cover glass 26 so as to enable hermetic sealing and protection for the device. The optical cover glass 26 is aligned in parallel with the micromechanical device and permanently connected to the support structure 32 of the microactuator structures 24. In the area of the optically effective range of the packaged microdevice, the support structure has a free aperture for unobstructed optical coupling and decoupling.

Figure 7:
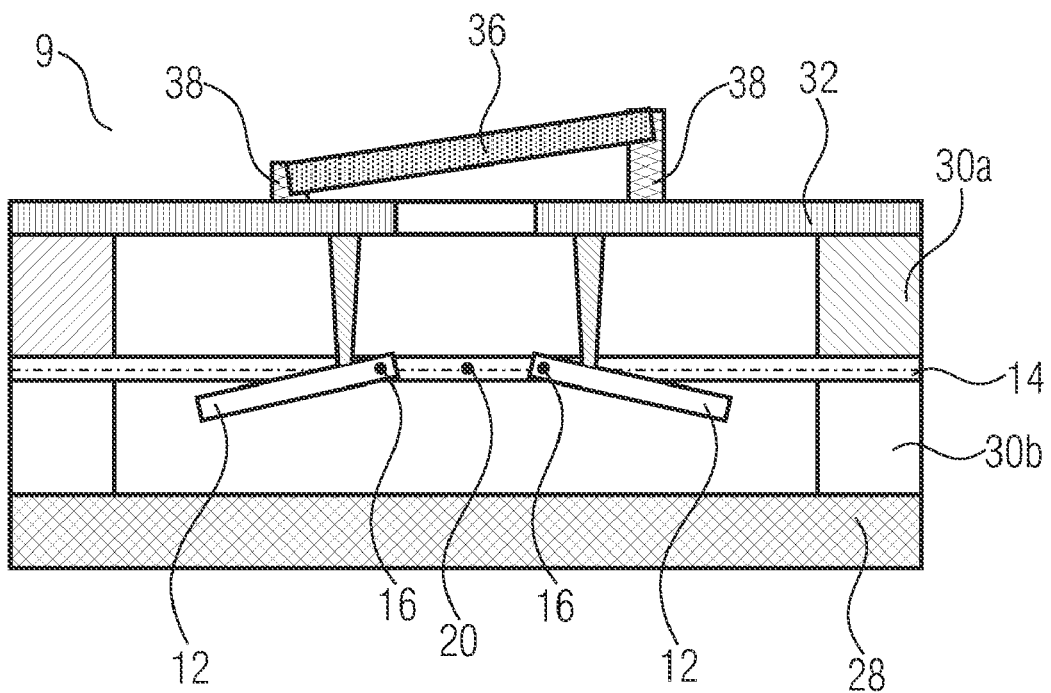
FIG. 7 is a cross-sectional representation, wherein the packaged micromechanical device is, on its top side, sealed by means of a cover glass, wherein the optical window is arranged on the packaged micromechanical device in a tilted manner.

In a further embodiment of the present invention, a device analogous to FIG. 5 is represented in FIG. 7, but the packaged micromechanical device 9 is, however, on its top side sealed by means of an optical cover glass 36, wherein the optical window is oriented in a tilted manner with respect to the packaged micromechanical device 9 and the support structure 32. Here, the tilting of the optical cover glass 36 may be effected via a correspondingly formed window mount 38, wherein the latter may be permanently connected to the support structure 32.

Figure 8:
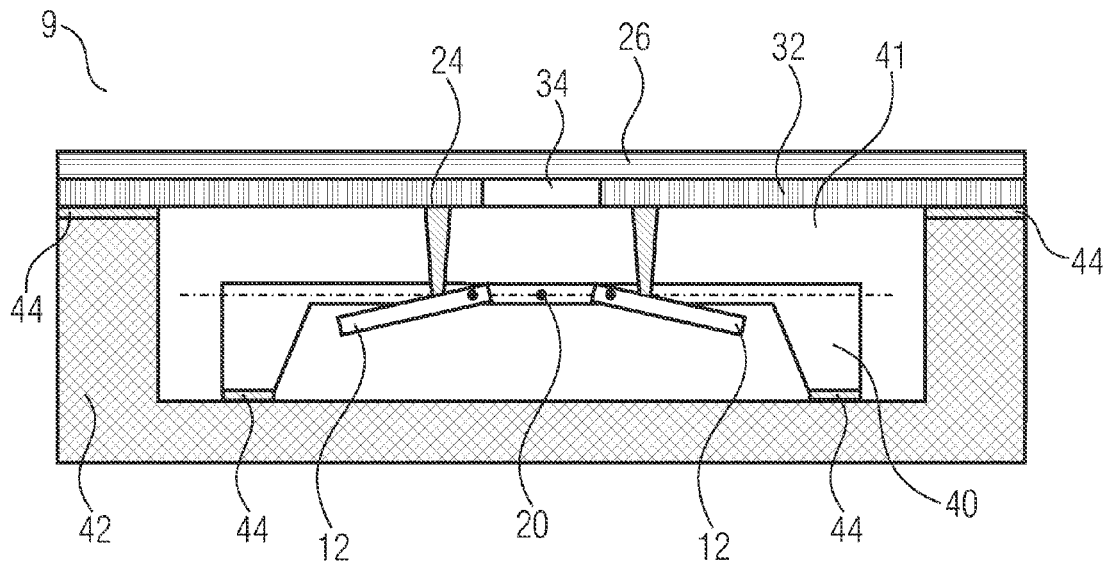
FIG. 8 is a cross-sectional representation of a micromechanical device packaged as a single device at chip level, according to a further embodiment of the present invention.

In FIG. 8, a further embodiment of the present invention is represented. A micromechanical device 9 is shown in the form of a single device 40 packaged at chip level having tilted electrode structures 12 deflected downwards. The micromechanical device chip 40 is positioned in a cavity 41 of a package 42, which may be comprised of a ceramic or metal, such as a metal-CAN package, plastic or glass, for example, and permanently connected thereto. The micromechanical device chip 40 may be connected to the external package 42 by e.g. adhering 44, bonding or soldering or any other connecting means. The support structure 32 of the microactuator structures 24 may be connected to the external package by means of adhering, bonding, soldering or any other connecting means, for example. The support structure, including the micromanipulator structures or microactuator structures, is aligned relative to the micromechanical device 40. The deflection or tilting of the two-dimensional structures is then effected in joining the support substrate 32 and the external package 42. If the device is an optical one, such as in this embodiment, the support structure may exhibit a free optical aperture 34 for unobstructed optical coupling and decoupling in the area of the optically effective ranges of the microdevice. For hermetically sealing the package, the entire package 42 may be sealed by means of a cover glass 26 aligned in parallel with the support structure 32 and permanently connected thereto.

Figure 9:
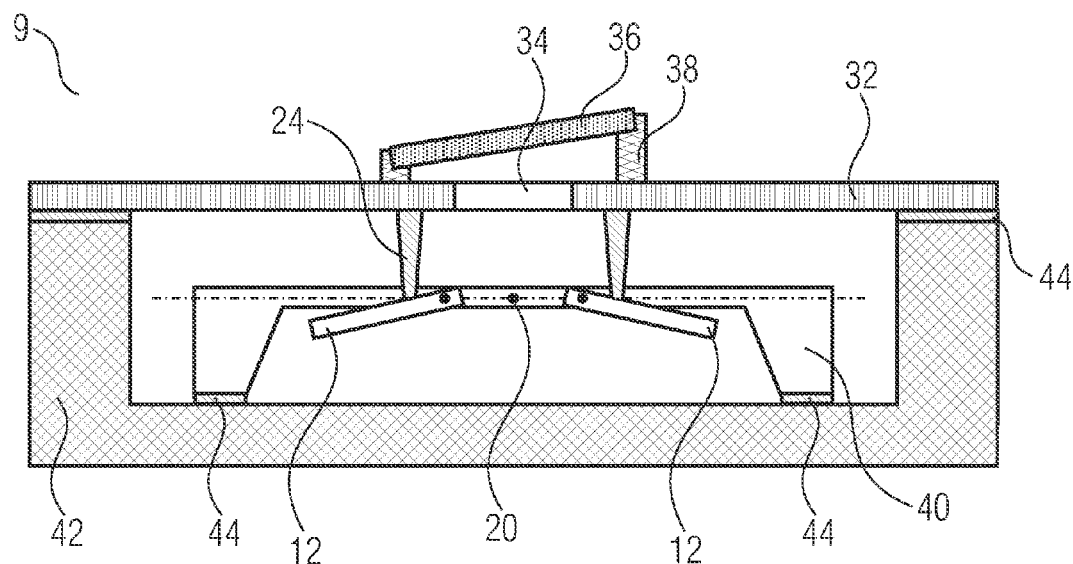
FIG. 9 is a cross-sectional representation of a micromechanical device packaged as a single device at chip level, which comprises an optical window tilted with respect to the micromechanical device.

Alternatively, as shown in the embodiment of FIG. 9, the micromechanical device 9 packaged at chip level as a single device 40 may, with its tilted structures 12 deflected downwards by means of micromanipulator structures 24, comprise an optical window 36 tilted with respect to the micromechanical device 9. The tilting of the optical window 36 may be achieved via a respectively formed window mount 38, wherein the latter may be permanently connected to the support structure 32. It may also be conceivable that the support substrate 32 itself serve as the window mount and for this purpose be correspondingly three-dimensionally structured, e.g. wedge-shaped, so that the optical window 36 is tilted with respect to the microdevice 40. The fabrication of such a three-dimensional support substrate may be effected by means of mechanical micro precision machining, micro forming, micro injection molding or by means of the so-called LIGA (lithographic galvanic forming) technology.

Figure 10:
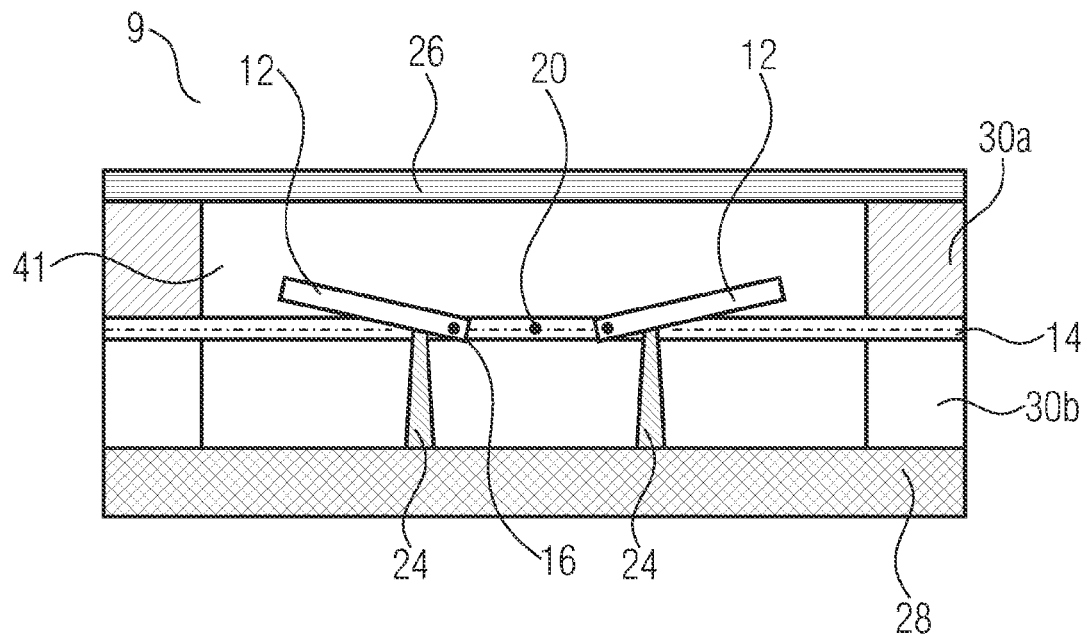
FIG. 10 is a cross-sectional representation according to a further embodiment of the present invention having two-dimensional structures deflected or tilted upwards.

FIG. 10 shows a further embodiment of the present invention in a cross-sectional representation through a micromechanical device 9 comprising the above-described structures. However, in this embodiment, the deflected tilted two-dimensional structures, which may be comb electrodes of a scanner mirror, are deflected in the direction of the cap structure or the optical cover glass 26. Concerning this, the microactuator structures 24 necessary for deflecting the two-dimensional structures may be located on the back and/or under side or on the bottom substrate of the micromechanical device 9 and be permanently connected thereto. The bottom substrate 28 may be aligned relative to the micromechanical device substrate 14 and permanently connected thereto such as by adhering, wafer bonding, soldering or by means of the SLID procedure. The deflection of the two-dimensional structures may be effected by means of the microactuator structures 24 in the joining or packaging of the bottom substrate 28 and the device substrate 14. Again, there may optionally be an optical cover glass 26 on the top side of the micromechanical device 9, which may serve as a window. The frame or frame structures 30a, 30b may serve as spacers to the optical window and form a cavity 41 above the optically effective area of the microdevice.

Figure 11:
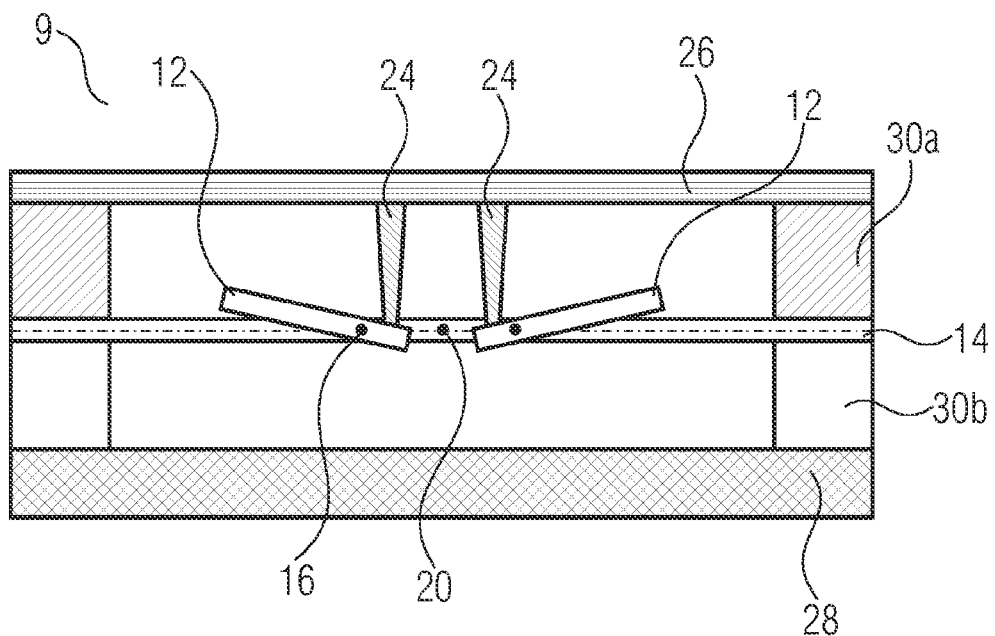
FIG. 11 is a cross-sectional representation of two-dimensional structures deflected upwards via microactuator structures.

FIG. 11 shows a further embodiment of the present invention with the micromechanical device exhibiting two-dimensional structures deflected in the direction of the device top side, i.e. in the direction of the cover glass 26. The microactuator structures necessitated for this purpose attack on the top side of the tiltable electrodes 12. The microactuator structures 24 are permanently connected to an optional support substrate 26 or directly to the optical cover glass. The tilting or deflection of the two-dimensional structures in the direction of the top side of the micromechanical device 9 is in this example achieved by the force action and the application of a torque on the short side of the attacking lever arm which is formed between the torsion springs 16 and the location of the force action on the electrodes 12. The cover glass 26 and/or the support structure may again be permanently connected to the microdevice substrate 14 via a spacer 30a. In the embodiment, only the cover glass 26 is shown without the optional support structure 32.

Figure 12:
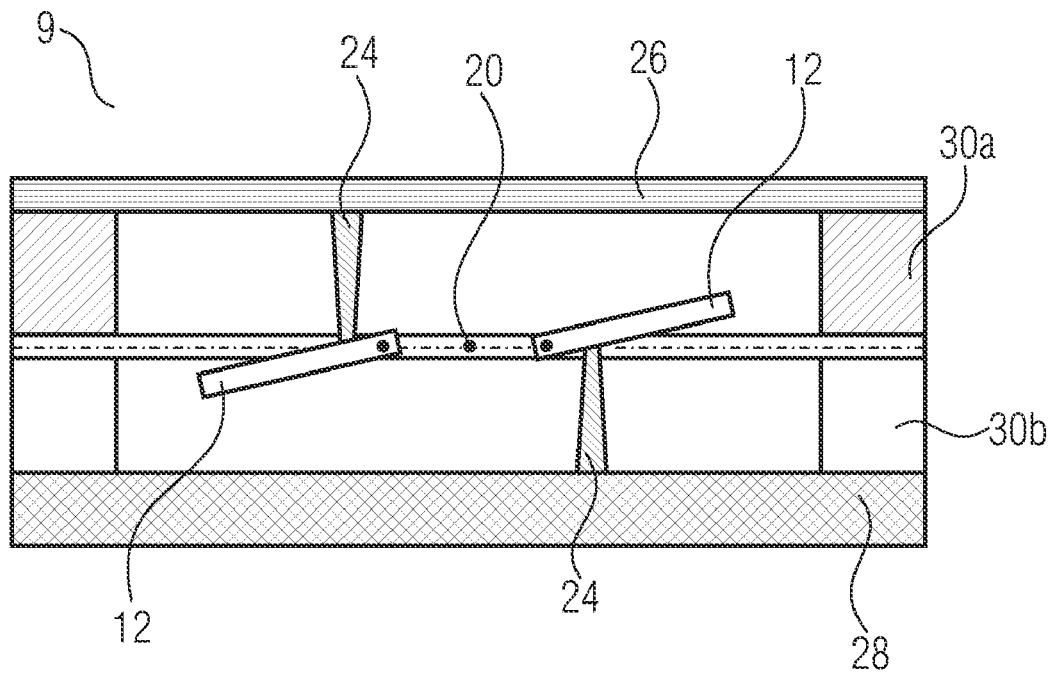
FIG. 12 is a cross-sectional representation of a further embodiment having two-dimensional structures deflected or tilted alternately upwards and downwards.

FIG. 12 shows an embodiment with tilted two-dimensional structures 12 alternately deflected upwards and downwards. Again, the tiltable, stationary comb electrodes 12 of the one-dimensional scanner mirror already mentioned above may be concerned. The microactuator structures 24 used for deflecting the two-dimensional structure are located both on the top and the under side of the micromechanical device. The microactuator structures 24 are connected either to the bottom substrate 28 and/or the front-side support structure or directly to the window glass 26. By means of the microactuator structures, the two-dimensional structures are deflected in the joining or packaging of the micromechanical device substrate 14 with the bottom substrate 28 and cover and/or window substrates 26 and the respective frame structures 30a and 30b.

Figure 13:
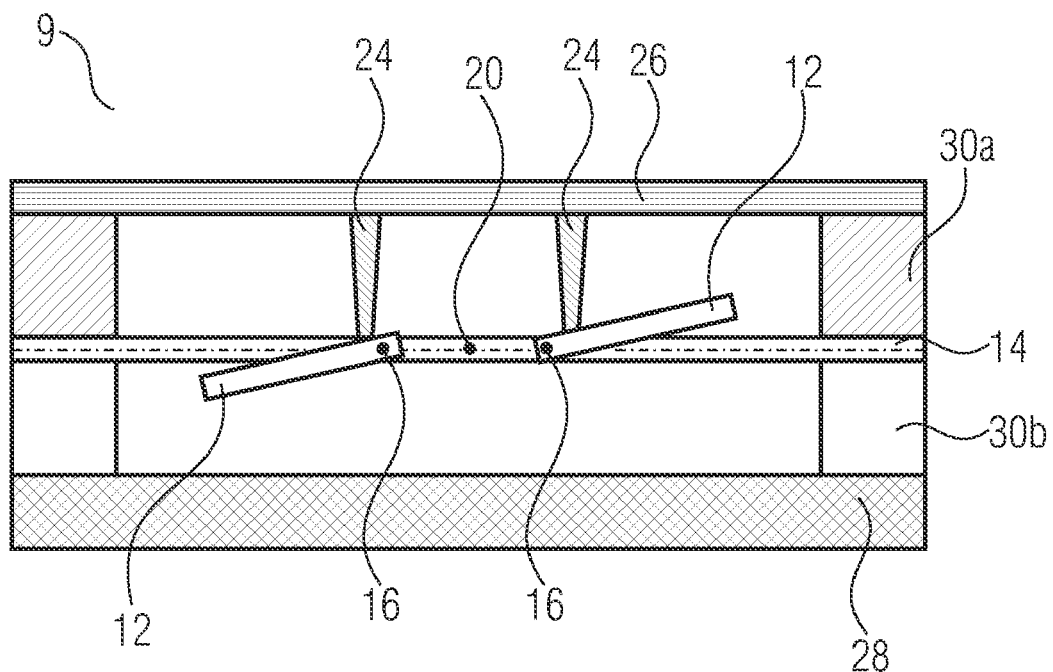
FIG. 13 is a cross-sectional representation of a further embodiment having two-dimensional structures deflected or tilted alternately upwards and downwards.

In the embodiment in FIG. 13, with tilted two-dimensional structures 12 deflected alternately upwards and downwards, the microactuator structures 24 attack on the top side and/or front side of the structures 12, i.e. from the top side of the device 9. The micromanipulator structures 24 are permanently connected to an optional support substrate or directly to the optical cover glass 26. The cover glass and/or the support structure is again permanently connected to the microdevice via a spacer of the frame structures 30a and/or 30b. In the embodiment shown, again only the cover glass is shown without the optional support structure.

The position of the contact pads 18 of the deflectable two-dimensional structures 12 for the force initiation of the micromanipulator structures is arranged such that the microactors alternately deflect or tilt the two-dimensional structures downwards and, alternately, upwards. A substantial advantage of the embodiment shown consists in the high robustness towards lateral alignment tolerances of microactuator structures and two-dimensional structures to be deflected, as lateral alignment tolerances also effect a tilting of the structures, with the result that the symmetry of the device is not disturbed.

Figure 14:
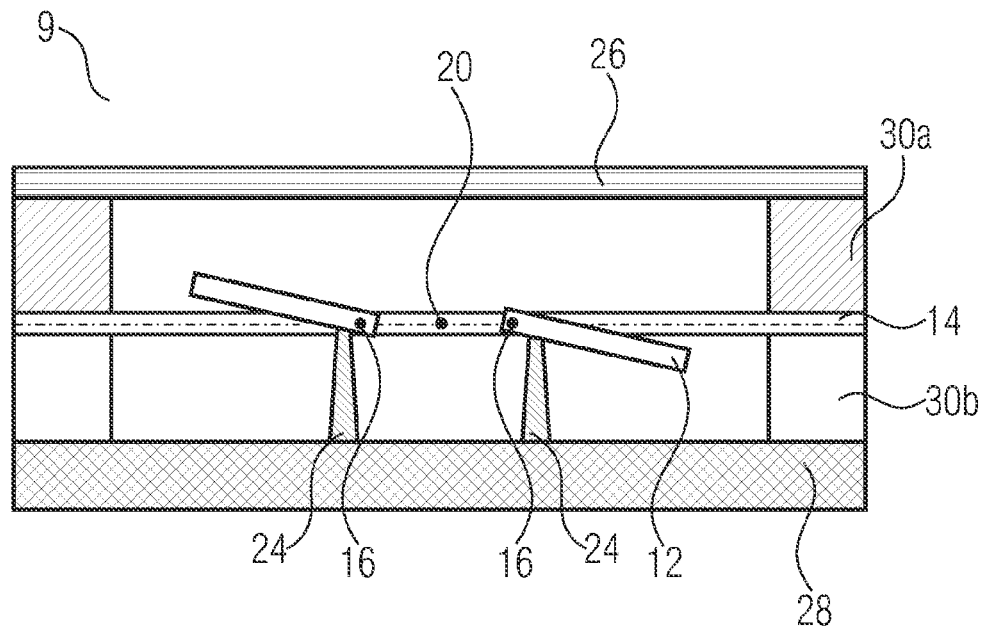
FIG. 14 is a cross-sectional representation of a further embodiment of the present invention having tilted two-dimensional structures deflected, alternately downwards and upwards, wherein the micromanipulator structures attack on the back side of the device.

FIG. 14 shows an embodiment analogous to FIG. 13 having two-dimensional structures alternately deflected in the directions of the top and under side of the micromechanical device. The microactuator structures 24 attack on the under side of the device, which is realized in the frame 14. The microactuator structures may be permanently connected to the bottom substrate, which is, in turn, permanently connected to the microdevice. In analogy to FIG. 13, the embodiment shown has the advantage of high robustness towards lateral alignment tolerances of microactuator structures and two-dimensional structures to be deflected, as deflected two-dimensional structures may also be created with lateral alignment tolerances, with the result that the symmetry of the device is not disturbed.

Figure 15:
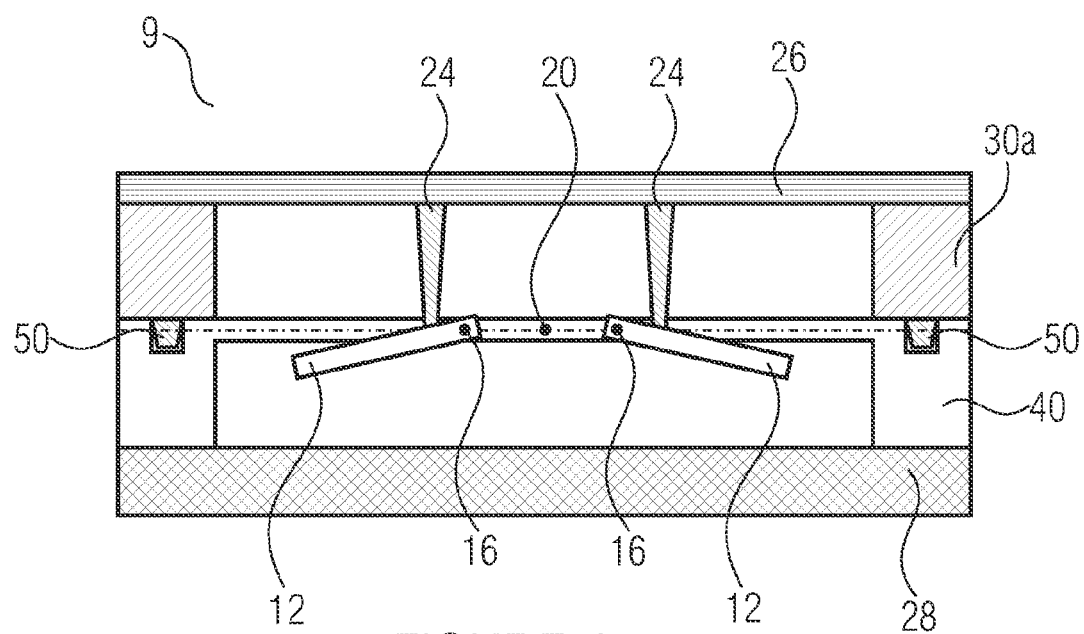
FIG. 15 is a cross-sectional representation of a schematic embodiment of a packaged microdevice having two-dimensional structures deflected by means of micromanipulators, which comprises self-aligning assembly structures, according to a further embodiment of the present invention.

FIG. 15 shows a schematic embodiment of a packaged microdevice 9 having two-dimensional structures pre-deflected via microactuator structures 24, wherein, for the reduction of assembly tolerances, a self-alignment of deflecting microactuator structures 24 and two-dimensional structures 12 to be tilted may be achieved by means of self-aligning assembly structures 50. The auto-alignment structures 50 are present both in the micromechanical device 40 and in the support substrate 26, 30a with the microactuator structures 24, which is to be joined thereto.

Figure 16:
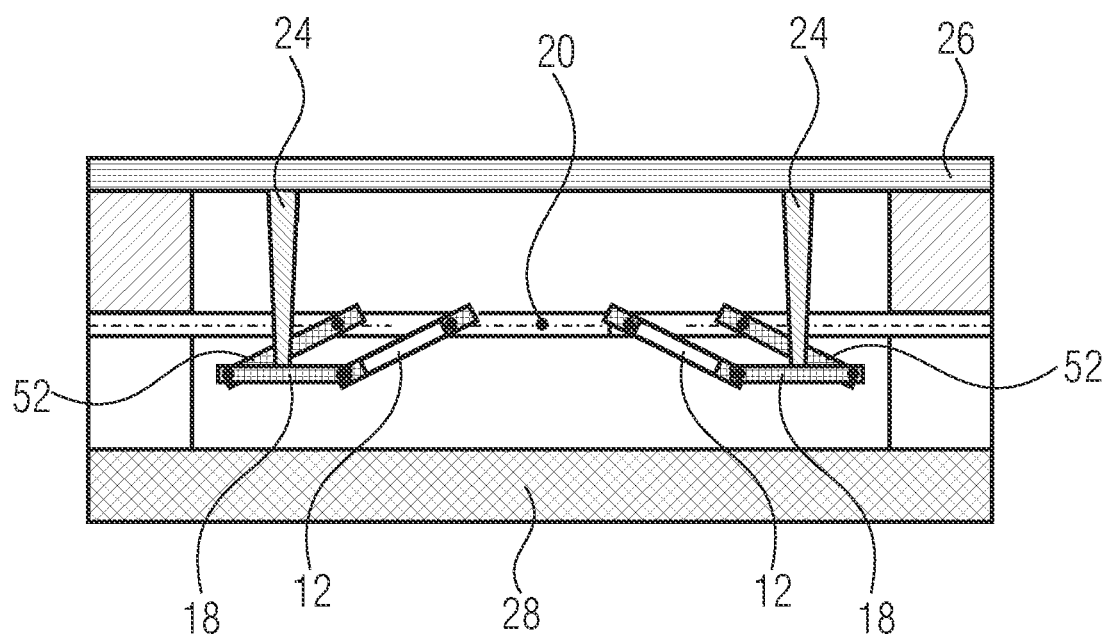
FIG. 16 is a cross-sectional representation of a micromechanical device comprising two-dimensional structures deflected by means of micromanipulators, the two-dimensional structures to be deflected being supported via a parallel joint and being arranged, in the deflected final state, in a manner tilted relative to the substrate plane.

FIG. 16 shows a further embodiment of a micromechanical device 9, wherein two-dimensional structures may be deflected by means of micromanipulator structures during the device packaging process. In contrast to all the above embodiments having the two-dimensional structures to be deflected rotatorily supported by means of torsion springs 16, the two-dimensional structures to be deflected in FIG. 16 are supported via a parallel joint 52. By means of supporting the deflectable two-dimensional structure, such as the electrode combs 12, as a parallel joint, a parallel shift of the contact pad 18 guided in parallel to the force initiation is effected in the structure deflection by means of the microactuator structures 24. In the embodiment shown in FIG. 16, the structure to be deflected, such as the stationary drive electrode 12, is rigidly coupled to the rotatorily supported linkage of the parallel joint 52 so that the relevant two-dimensional structure 12 is tilted. The absolute tilt angle of the two-dimensional structure substantially only depends on the height of the parallel shift of the contact pad 18 as caused by the lowering of the microactuator structure 24 during packaging. In contrast to that, the lateral position of the force initiation within the contact pad 18 is of no importance, so that the resulting tilt angle of the two-dimensional structure is independent of the otherwise critical lateral alignment tolerances. Thereby, identical tilt angles with large reproducibility as well as better symmetry of the device may be realized for several two-dimensional structures to be simultaneously deflected.

In the embodiment shown in FIG. 16, the two-dimensional structures 12 to be deflected are both tilted downwards, wherein the microactuator structures 24, which are permanently connected to the window substrate 26 and/or an optional support substrate, attack the contact pad 18 from the top side and shift same in the direction of the bottom substrate 28 in a defined and parallel manner so that the two-dimensional structure, such as the stationary drive electrode structure 12, is symmetrically tilted.

Figure 17:
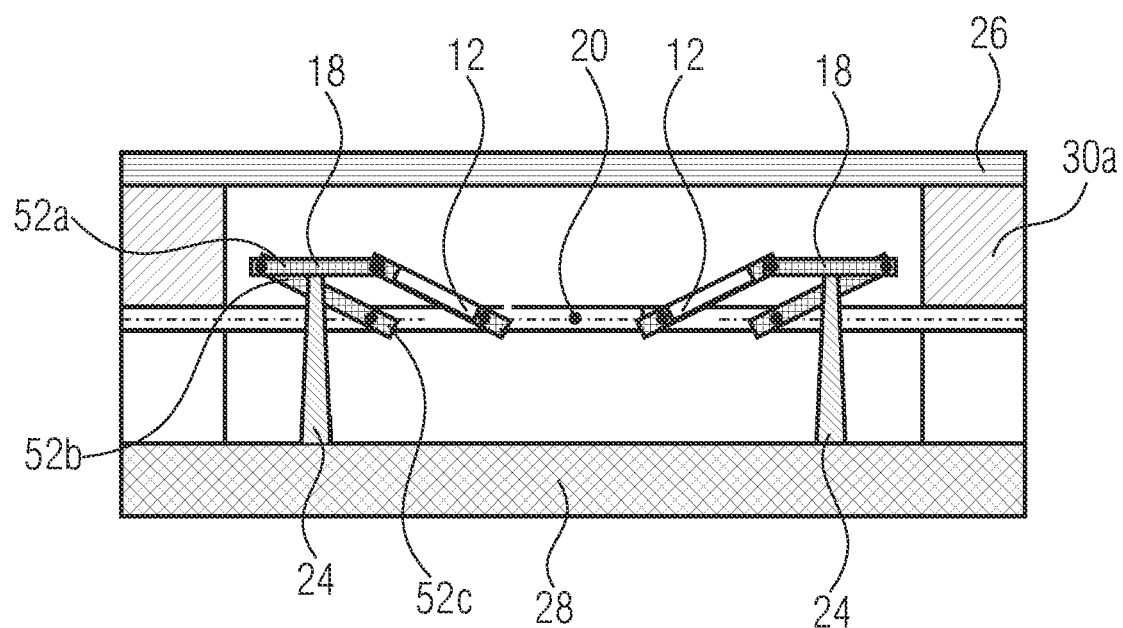
FIG. 17 is a cross-sectional representation of a micromechanical device, wherein the two-dimensional structures to be deflected comprise a parallel joint and are tilted upwards, wherein the deflecting micromanipulator structures attack from the device back side.

FIG. 17 shows an embodiment in analogy to FIG. 16, wherein the two-dimensional structures 12 to be deflected are tilted in the direction of the cap structure 26. For this purpose, the deflecting micromanipulator structures 24 attack from the device back side and/or the bottom substrate 28 so as to, as a result of the support via a parallel joint 52a-c, effect a parallel shift of the contact pads 18 as well as a symmetrical tilting of the two-dimensional structures in the direction of the cap structure 26. The microactuator structures 24 may be permanently connected to the bottom substrate 28.

Figure 18:
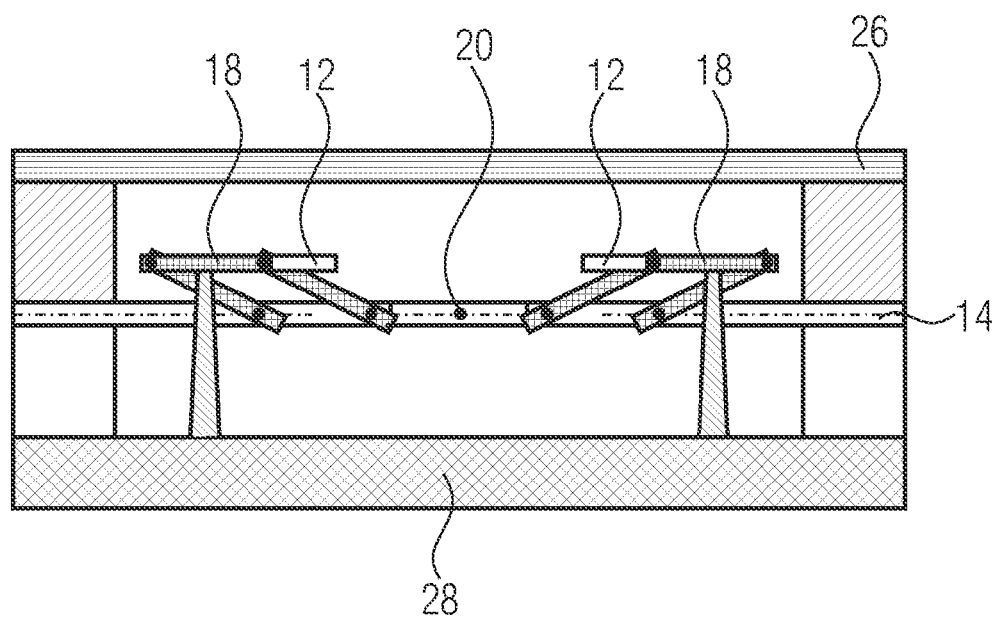
FIG. 18 is a cross-sectional representation of a micromechanical device, wherein the two-dimensional structures to be deflected, which comprise a parallel joint, are rigidly coupled to a contact pad serving for force initiation so that the two-dimensional structures will be aligned in parallel in the deflected final state.

FIG. 18 shows a further embodiment similar to FIG. 17. In contrast to FIG. 16, the two-dimensional structure 12 to be deflected is permanently, i.e. rigidly, coupled to the contact pad 18 serving for the transmission of force. Hereby, in lowering the micromanipulator structures, i.e. in packaging, the two-dimensional structure 12 to be deflected is shifted upwards in parallel in a manner simultaneous to the contact pad 18 so that the two-dimensional structure 12, in its deflected final state, is aligned in parallel, at a distance defined via the geometry and/or the height of the micromanipulator, and positioned above the device substrate 14.

Figure 19:
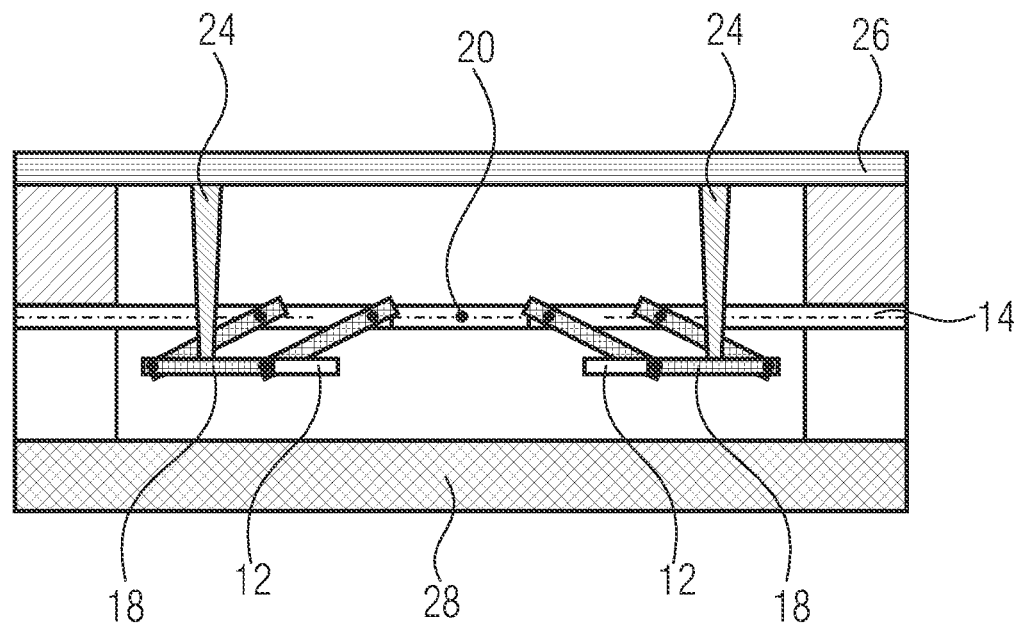
FIG. 19 is a cross-sectional representation of a micromechanical device, wherein the relevant two-dimensional structures are deflected, analogously to FIG. 18, in a manner parallel to the initial substrate, in this case, however, in the direction of the package bottom.

In analogy to FIG. 16, FIG. 19 shows a further embodiment of a packaged micromechanical device, wherein the relevant two-dimensional structures 12 are deflected in parallel to the device frame substrate 14. In contrast to FIG. 18, the deflection of the two-dimensional structures 12 is effected downwards and in the direction of the bottom substrate 28, by means of the microactuator structures 24 attacking on the top side of the contact pads 18, in analogy to FIG. 16.

Figure 20:
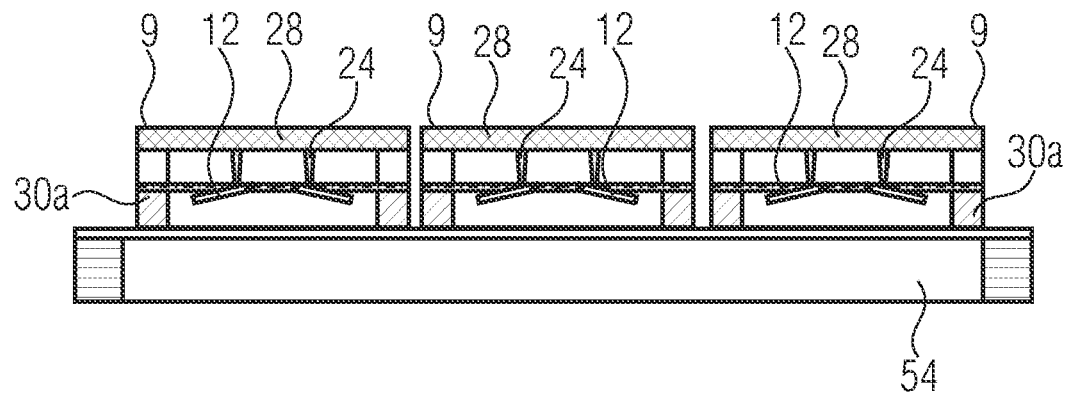
FIG. 20 is a cross-sectional representation of multiple packaged microdevices adhered to a support foil or a support substrate without an optical window cover substrate having microactuator structures attacking from the back side.

FIG. 20 shows the cross-sectional representation for dicing packaged microdevices 9 that do not comprise any optical window cover substrate. The two-dimensional deflected structures 12 are deflected by means of microactuator structures 24, attacking via the back side, from the bottom substrate 28. FIG. 20 shows the state after the dicing of the devices in the wafer matrix by means of sawing. A spacer frame structure 30a, which is adhered to a support foil 54, the so-called blue tape, or any other auxiliary support structure during the dicing such as a sawing of the wafer, is located on the device front side and is permanently connected thereto.

Figure 21:
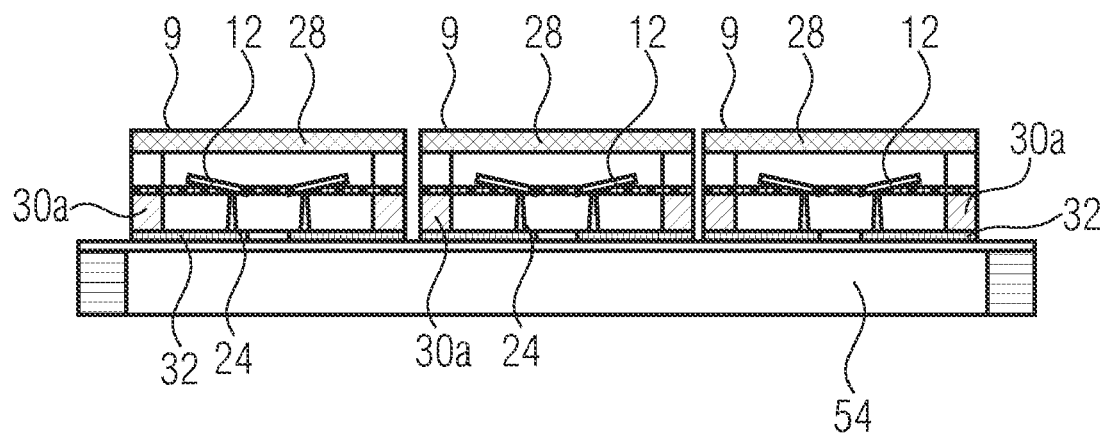
FIG. 21 is a cross-sectional representation of packaged microdevices with an optical window cover substrate having microactuator structures attacking from the device front side and deflected two-dimensional structures, wherein the wafer matrix is adhered to a support foil.

The embodiment of FIG. 21 again shows the dicing of packaged microdevices 9 without an optical window cover substrate, comprising, however, two-dimensional structures 12 deflected via microactuator structures 24 attacking from the front side, i.e. from the support substrate 32. The state after the dicing of the devices in the wafer matrix by means of sawing is shown. Located on the device front side and/or top side, there is a spacer frame structure 30a permanently connected thereto, as well as the support substrate 32 of the microactuator structures 24, which is permanently connected thereto. In dicing, e.g. wafer sawing, the wafer matrix may, with the front-side support substrate 32, be adhered to a support foil 54, such as a so-called "blue tape" or any other auxiliary support substrate.

Figure 22:
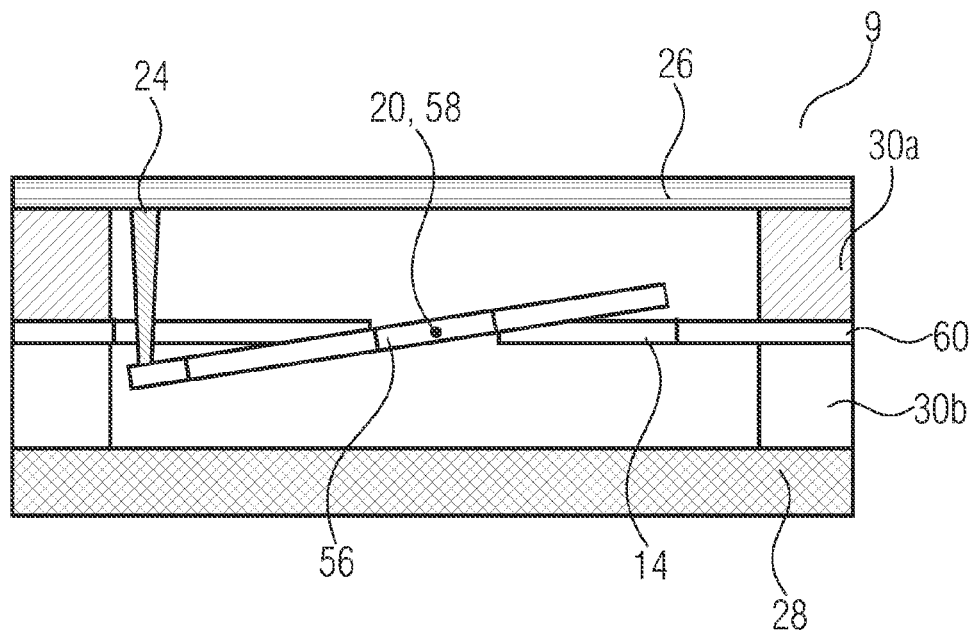
FIG. 22 is a cross-sectional representation of a further embodiment of the present invention of a microdevice permanently tiltedly deflected relative to the substrate and to the optical window substrate via respective microactuator structures in the device packaging.

As an embodiment of a micromechanical device 9, FIG. 22 shows a scanner mirror 56 formed in the device substrate 14. The scanner device 56 is rotatorily supported in an external stationary frame 60 via additional torsion springs 58 arranged coaxially with respect to the actual torsion springs 20. The entire micromechanical device 56 is then tilted together with the device substrate 14 during packaging.

Again, the scanner mirror 56 comprises a mirror plate 15 and torsion springs 16, amongst others, for the deflection of the stationary electrodes 12, which include a contact pad 18.

Figure 23:
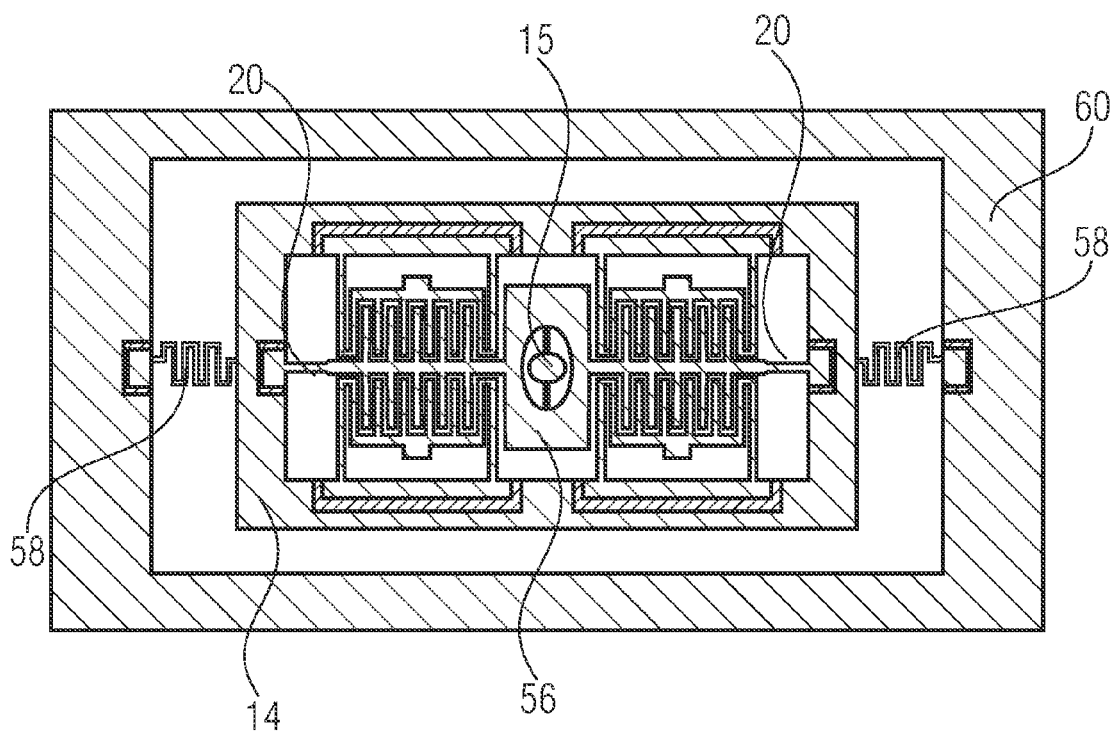
FIG. 23 is a top-view representation of a micromechanical two-dimensional scanner mirror for a packaging according to FIG. 22.

FIG. 23 shows the embodiment of a tilted microdevice substrate 56 equivalent to FIG. 22, which is permanently deflected via respective microactuator structures 24, in the device packaging. During the device sealing, i.e. during the packaging, the entire micromechanical device 56, such as a two-dimensional micro mirror is tilted via the microactuator structures 24 together with the substrate 14, which, as described above, for this purpose is rotatorily supported in an external stationary frame 60 via torsion springs 58. The meandering springs 58 either exhibit the same torsion axis 20 as the mirror plate 15 of the two-dimensional scanner 56 or a torsion axis coaxial or rotated thereto. The external stationary frame 60 may be permanently connected to the bottom substrate 28 and a spacer and window substrate 26 aligned in parallel thereto. The microdevice substrate 14 with the two-dimensional scanner mirror 56 may therefore be arranged in a manner tilted relative to the cap structure 26.

This means that the method of generating 3D structures may be performed on a wafer such that same contains 2D structures manufactured in the wafer matrix, released and connected to the wafer via bearings which are designed for static anchorage outside the wafer plane. The 2D structures may be moved out of the wafer plane and be erected to form 3D structures by means of one or more micromanipulators. The deflection or tilting of the 2D structures for the realization of 3D structures may be effected during the packaging process of the micromechanical device. After their deflection out of the wafer plane, the 2D structures may be anchored in their position, wherein the micromanipulators are permanent components of the device.

In embodiments of the invention, the micromanipulator may also be a permanent component of the two-dimensional structure. I.e., the two-dimensional structure may itself comprise the micromanipulator. The micromanipulator integrated into the two-dimensional structure may then be deflected and arranged between the package and the two-dimensional structure such that the two-dimensional structure is deflected out of a plane of the substrate.

The micromechanical device with the two-dimensional structure may be a scanner mirror with drive and/or comb electrodes, for example, which may be deflected quasi-statically, resonantly or statically. In the following, the two-dimensional structure may also be referred to as a micromechanical functional structure. For the quasi-static or resonant operation of the micromechanical device according to a further embodiment of the present invention the micromechanical device may further comprise means for providing a varying voltage. These means may comprise conductive-trace lead-ins, contact pads and circuits suitable for applying the respective voltages to the comb electrodes. These means may also comprise a control apparatus, whereby periodic voltages having a frequency necessary for the proper operation of the micromechanical functional structure may be applied to the comb electrodes in the resonant case. The control apparatus may further comprise means for detecting the zero crossings of the two-dimensional micromechanical structure oscillating on a main axis. Furthermore, the micromechanical device may serve as a sensor and use the above means for detecting a movement of the micromechanical functional structure.

In a further embodiment of the present invention, rather than torsion springs, flexion springs may be used, for example, for the suspension of fixed combs of a scanner mirror.

Additional comb-electrode structures of a scanner mirror in another embodiment of the invention may be disposed on the micromechanical device such as the scanner plate. In contrast to the above embodiments, the micromechanical functional structure may be suspended rotatorily and two-dimensionally such that the micromechanical functional structure, such as a mirror plate, may be deflected in two directions and shifted translationarily. Similarly, such a structure may have the torsion axes mutually rotated by 90 degrees. The rotation axes may be mutually rotated by an arbitrary angle. As a special case, a rotatorily constructed two-dimensional structure may comprise collinear axes, for example, wherein, by means of the collinear axes, a larger deflection angle may specifically be achieved. The two-dimensional rotatorily deflectable structure may be configured such that one of the deflection movements is achieved by means of a different principle of effect, such as a magnetic, piezoelectric, thermal or acoustic principle of effect. The two ways of deflection in two dimensions may both be effected in a quasi-static or resonant manner, or one deflection may be effected in a quasi-static manner and the other in a resonant manner.

Furthermore, a micromechanical device comprising a two-dimensional rotatorily deflectable structure may be configured such that one of the deflections may be realized by means of an electrostatic in-plane drive (EP 11 23 526).

The micromechanical functional structure may be rotatorily deflectable in one or two dimensions, for example, wherein at least one deflection direction is operated by means of the tilted comb arrangement described in the embodiments, and may comprise additional diffractive elements on or in the micromechanical functional structure and/or additional highly reflective mirror platings. They may be diffractive optical elements (DOE), gratings, metallic mirror platings, dielectric mirror platings, coated metallic mirror platings and the like.

In embodiments, the comb electrodes (combs) of a scanner mirror may, by one or more mandrels, be deflected out of or under the chip plane given by the rest position of the mirror plate and the frame structure, in any direction, depending on the design and structuring of the micromechanical device. The deflection of the combs may specifically be effected such that all combs are deflected upwards, downwards, in symmetry with an axis through the device center or in point symmetry with the device center or completely asymmetrically.

The micromechanical device may comprise a control apparatus or may be driven by a control apparatus so that the creatable movement of the micromechanical functional structure follows a ramp with fast reverse motion. The control apparatus may be configured such that a linear translatory movement is caused by the electrostatic comb drive, which is functionally described by $z(t)=C1 \times t$, wherein the exact linear functional connection between the deflection z and the time t is given by a constant $C1$. In analogy, the electrostatic comb drive may be controlled such that a linear rotatory movement with an angle deflection $\phi(t)=C2 \times t$ is yielded. The deflection angle $\phi$ is therefore directly proportional to the deflection time t of the rotatory movement.

The two-dimensional structure, i.e. the scanner mirror, for example, may also exhibit a form of movement adapted to the application so that a linear movement of a laser spot deflected by a scanner mirror is effected on a view screen. The control for applying a respective voltage to the tilted electrode combs of the present invention may also be effected in that the back-and-forth course of a laser spot deflected by the scanner mirror is effected at different speeds or at the same speed, wherein the reversal points of the back-and-forth course are blanked out on the screen.

In a further embodiment, the tilted comb electrodes and the ways for translatory movement may also be used for an exact optical path-length modulation in optical appliances by means of a respective control apparatus. The optical path-length modulation may be effected both translatorily and rotatorily. The translatory movement by means of the tilted comb structure may also be used for extending the optical path length of an appliance. The two-dimensional structure may, for example, also be translatorily moved in one or two dimensions, wherein the movement in at least one direction is effected by means of the tilted comb arrangement, wherein additional diffractive elements are arranged in the micromechanical device. Examples are DOEs, gratings, metallic mirror platings, dielectric mirror platings, coated metallic mirror platings and the like.

The micromechanical device of the present invention may be used for the optical path-length modulation for confocal microscopes, for Fourier transform spectrometers and/or for adjusting the resonator length in lasers, as well as for selecting and/or varying the laser wavelength. An arrangement of a linear or two-dimensional array constructed of one- or two-dimensional, translatory or rotatory elements according to the present invention is also conceivable.

The micromechanical functional structure may be a mirror plate having both the front and the back side mirror-plated.

Micromechanical devices realizing a combination of the suggested approach with the tilted comb structures with other principles of effect, which are operated quasi-statically, resonantly, translatorily or rotatorily, are also conceivable.

In a further embodiment of the invention, for feeding further electrical potentials, the micromechanical devices may comprise multi-springs or metallic conductive traces via springs or highly doped areas in a weakly doped substrate. In the micromechanical device, fingers of an electrode comb may be attached to a torsion spring or a device area that is more rigid than a torsion spring, on which the micromechanical device may be rotated. The fixed comb structures with their fingers and the movable comb structures with their fingers may be formed in different substrate or frame layers. In addition, rather than torsion springs, flexion springs may be used, which comprise contact pads, which may be subjected to a force action for the deflection of the fixed combs, and/or which may be shifted in parallel via a four-hinged joint.

According to embodiments, the micromechanical device may be employed for image projection or for positioning a light or laser beam. The micromechanical device may, for example, be employed for deflecting or positioning a light or laser beam, which is operated in a continuous or pulsed manner.

The Micromechanical device may be formed in varying substrates such as silicon, gallium arsenide, indium phosphide, gallium nitride, silicon carbide or any other substrates. The actor layer may be poly- or mono-crystalline.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method of fabricating a micromechanical structure, comprising:
    forming a deflectably supported two-dimensional structure in a substrate; and
    arranging the deflectably supported two-dimensional structure during packaging of the micromechanical structure such that an integrated micromanipulator is arranged between the package and the two-dimensional structure so as to effect a deflection of the two-dimensional structure out of a plane of the substrate; and
    fixing the two-dimensional structure in the deflected state.

2. The method of claim 1, further comprising releasing the two-dimensional structure in the substrate.

3. The method of claim 1, wherein the fixing is effected in a material-fit, form-fit or force-fit manner.

4. The method of claim 1, wherein the two-dimensional structure is formed in a wafer.

5. The method of claim 1, wherein the package comprises a cap structure, a bottom structure and a frame structure.

6. The method of claim 5, wherein the cover structure, the bottom structure or the frame structure comprises the micromanipulator.

7. The method of claim 1, wherein the arranging is effected such that a micromanipulator integrated into the two-dimensional structure is arranged between the package and the two-dimensional structure so as to effect a deflection of the two-dimensional structure out of a plane of the substrate.

8. A micromechanical device, comprising:
    a package;
    a substrate;
    a two-dimensional structure arranged in the substrate; and
    a micromanipulator which is either connected to the package or to the two-dimensional structure, and which is in engagement with the two-dimensional structure or the package such that the two-dimensional structure is deflected out of a plane of the substrate; wherein
    the deflected two-dimensional structure is fixed in the deflected state.

9. The micromechanical device of claim 8, wherein the package comprises a cap structure a bottom structure and a frame structure.

10. The micromechanical device of claim 9, wherein the substrate, the cap structure and the bottom structure are arranged in parallel to one another.

11. The micromechanical device of claim 8, wherein the two-dimensional structure is a one- or two-dimensionally movable scanner mirror.

12. The micromechanical device of claim 8, wherein the two-dimensional structure comprises at least one contact pad comprising a mechanically wear-resistant or ductile contact layer in contact with the micromanipulator.

13. The micromechanical device of claim 8, wherein the package comprises an area exhibiting a high transmittance for electromagnetic radiation incident and interacting with the two-dimensional structure.

14. The micromechanical device of claim 13, wherein the area comprises an optical window structure in the cap structure.

15. The micromechanical device of claim 14, wherein the optical window is arranged in a manner tilted relative to the cap structure and the substrate.

16. The micromechanical device of claim 8, wherein the micromanipulator is integrated in the two-dimensional structure.

* * * * *